United States Patent [19]

Collins et al.

[11] Patent Number: 4,827,137
[45] Date of Patent: May 2, 1989

[54] SOFT VACUUM ELECTRON BEAM PATTERNING APPARATUS AND PROCESS

[75] Inventors: George J. Collins; Jayaram Krishnaswamy, both of Fort Collins, Colo.

[73] Assignee: Applied Electron Corporation, Albuquerque, N. Mex.

[21] Appl. No.: 856,950

[22] Filed: Apr. 28, 1986

[51] Int. Cl.$^4$ ............................................. H01V 37/30
[52] U.S. Cl. ................................ 250/492.2; 250/398
[58] Field of Search ........................... 250/492.2, 398; 204/192.12, 298

[56] References Cited

U.S. PATENT DOCUMENTS

| | | | |
|---|---|---|---|
| 4,119,688 | 10/1978 | Hiraoka | 264/22 |
| 4,321,470 | 3/1982 | Kaplan et al. | 250/492.2 |
| 4,366,383 | 12/1982 | Sano et al. | 250/398 |
| 4,496,449 | 1/1985 | Rocca et al. | 250/492.2 |

OTHER PUBLICATIONS

"Glow Discharge", *McGraw-Hill Encyclopedia of Science and Technology*, 6th Edition, 1987, vol. 8, pp. 137–138.

*Primary Examiner*—Craig E. Church
*Assistant Examiner*—Jack I. Berman
*Attorney, Agent, or Firm*—William E. Hein

[57] ABSTRACT

A cold cathode glow discharge electron gun operating in the abnormal glow region produces a wide area collimated electron beam employed for flood exposure of thin film materials through electron beam transmission masks, resulting in spatially localized exposure and patterning of the thin film materials.

30 Claims, 2 Drawing Sheets

SOFT VACUUM ELECTRON BEAM PATTERNING APPARATUS AND PROCESS

BACKGROUND OF THE INVENTION

Pattern transfer is a lithographic process of utmost importance in the fabrication of VLSI circuits, video discs, far infrared couplers, micro diagnostic devices for internal surgery, x-ray zone plates, and Josephson Junction devices. There are four major lithography methods in use of fabricating microstructures in the manufacture and packaging of very large scale integrated circuits. These are ultraviolet (350–430 nm) and deep ultraviolet photolithography (less than 330 nm) using incoherent and coherent light sources, soft x-ray lithography, electrom beam lithography, and ion or proton beam lithography. For obtaining submicron sized features, electron beam lithography is found to be a superior method to optical photolithography, deep ultraviolet photolithography, and even x-ray lithography. Ion beams even exceed electron beams in spatial resolution, but the penetration depth of ion beams is smaller, causing non-uniform resist exposure versus resist depth. Higher energy ion beams are capable of greater resist penetration but they may damage the underlying substrate, resulting in radiation damage and associated loss of reliability of the final fabricated components.

Electron beam lithography enjoys a favored position in research because of its excellent spatial resolution capability. Feature sizes as small as 100 Angstroms in electron sensitive organic resists and even 10 Angstroms in inorganic resists have been achieved. There are basically two types of processes employed in electron beam lithography, namely, serial direct write systems which use programmed deflection of point source electron beams and parallel proximity printing which uses a combination of a wide area electron beam and a wide area electron beam transmission mask. Both of these prior art methods use a thermionically created electron beam system operating in a high vacuum environment. The direct write systems use a tightly focused spot which is moved over the surface of the resist by electromagnetic forces under the control of a computer on which the pattern is pre-programmed. Subsequently, the exposed regions are usually wet developed and sometimes dry developed to reveal the exposed spatial features. The throughput of wafers or die packages per hour, however, is low and the cost is high for direct write systems.

The low throughput problem is overcome to some extent by the use of wide area flood exposure electron beam systems. In the flood exposure system using a photocathode, ultraviolet radiation is used to produce a patterned source of photo-electrons from an ultraviolet transmission mask coupled to a photoemitting surface. The resultant spatially patterned wide area electron beam is subsequently used to spatially expose the resist over a wide area. These parallel print systems are also expensive because they require a high quality ultraviolet transmission mask and also require a high vacuum electron beam system and photoemitting surface. Throughput, however, is improved over direct write systems for both wafers and die packages. An alternative flood exposure system uses a wide area electron transmission mask in close proximity to the resist surface. Electrons transmitted through the mask interact directly with the resist or polymer material on the wafer or die package and bring about molecular weight changes that result in solubility changes. This conventional proximity (1:1) method also requires a further development step, either wet or dry. Also reported in the prior art are projection (n:1) electron beam systems in which a large area electron beam passes through a wide area electron transmitting mask. The patterned electron beam is then passed through a demagnifying magnetic device to reduce the size of the pattern and exposure the resist or polymer material located on the wafer or die package. This conventional projection method also requires a further wet or dry development step. All of the previously described prior art types of flood exposure electron beam systems require a high vacuum ambient environment, a hot filament to supply electrons, and a high voltage to accelerate those electrons. In addition, the wide area electron beam of the latter system described above is usually a modified form of a scanning point source electron microscope having a wide area (mm×mm) beam.

In summary, the prior art electron beam systems for wafer and packaging lithography described above are disadvantageous in that they require high vacuum environments, the throughput of exposed wafers and die packages is low, and they require a further development step to complete the pattern delineation process in the resist or polymer material. These requirements make such systems very expensive. Moreover, the throughput of conventional electron beam lithography will be more limited in the future as wafer sizes increase to six and eight inches in diameter and die sizes increase from 6 mm to 2 cm on a side.

SUMMARY OF THE INVENTION

As stated above, the two major disadvantages of the prior art in the field of electron beam wafer and die package lithography are high equipment cost and low wafer or die throughput. The present invention addresses both problems simultaneously. High throughputs of patterned resist or polymer over wide areas at low cost are possible. The exposure takes place at a system vacuum which is two to three orders of magnitude lower (typically $10^{-2}$ Torr) than the conventional ultra high vacuum systems (typically $10^{-5}$ Torr). In this much lower vacuum range, high pumping speeds are possible at low cost. Condensible vapors, unavoidable products generated by electron beam exposure and which could be very harmful to a high vacuum system, are of relatively minor importance in the present invention. This occurs both due to their negligible partial pressures compared to the system background pressure and due to the high pumping speeds possible in the soft vacuum region. The problem of condensible vapors is even more serious in the case of new generation resists and packaging polymers which have been modified to have high etch resistance through graft polymerization.

Using abnormal glow discharge electron beam generation, large area ($>10$ cm$^2$) and high flux electron beams ($>0.1$ amperes/cm$^2$) can be produced with excellent spatial uniformity and a high degree of collimation at high efficiency. Both large area and high flux are excellent features for flood exposure of resists and packaging polymers through electron beam transmission masks. The use of an abnormal glow discharge electron beam permits higher currents at lower beam energies as compared to prior art high vacuum thermionic guns. Hence, the backscatter from the substrate layer is smaller, thereby improving spatial resolution at high throughput rates. Use of lower energy electrons at higher current levels, in accordance with the present invention, also results in reduced substrate damage, thus contributing to improved device reliability. Electron beam transmission mask heat arising from electron beam impingement is easier to dissipate in the present soft vacuum method than in the prior art high vacuum methods because of the additive strong convective heat transfer available under soft vacuum conditions. Due to the space charge neutralization occurring in soft vacuum conditions, the electrostatic charging problems of electron beam transmission masks are less severe than in high vacuum systems of the prior art that create only a single charge particle species.

In certain cases the electron beam itself is able to remove the thin film resist or packaging polymer material from the spatially localized regions on which the electron beam impinges. In these cases the subsequent wet or dry development process is superfluous because simultaneous exposure and self-development have already occurred. Spatially selective self-development of resist and packaging polymer patterns over a wide area is an important practical advantage of the present invention. It contributes to higher wafer and die package throughput, a lower degree of contamination during wet development and, more importantly, a lower degree of heavy metal contamination of the wafer or die package that may occur during wet development. In a pulsed electron beam mode, rather than a CW mode of glow discharge electron beam operation, ablation of the irradiated surfaces occurs through the use of high transient peak power electron-resist or electron-packaging polymer interactions.

DESCRIPTION OF THE ILLUSTRATED EMBODIMENT OF THE INVENTION

Figure 1:
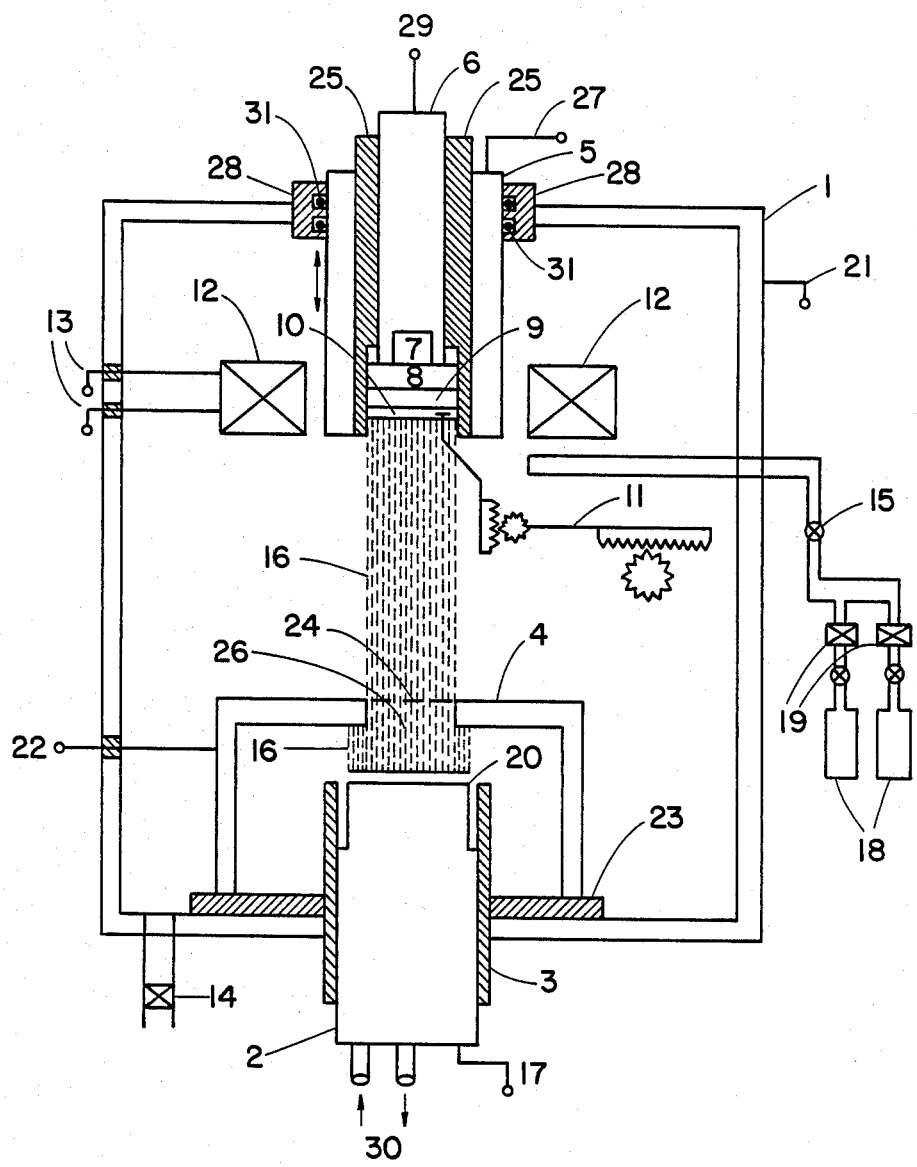
FIG. 1 is an illustration in cross-section of a soft vacuum electron beam exposure and development apparatus in accordance with the preferred embodiment of the present invention.
Figure 2:
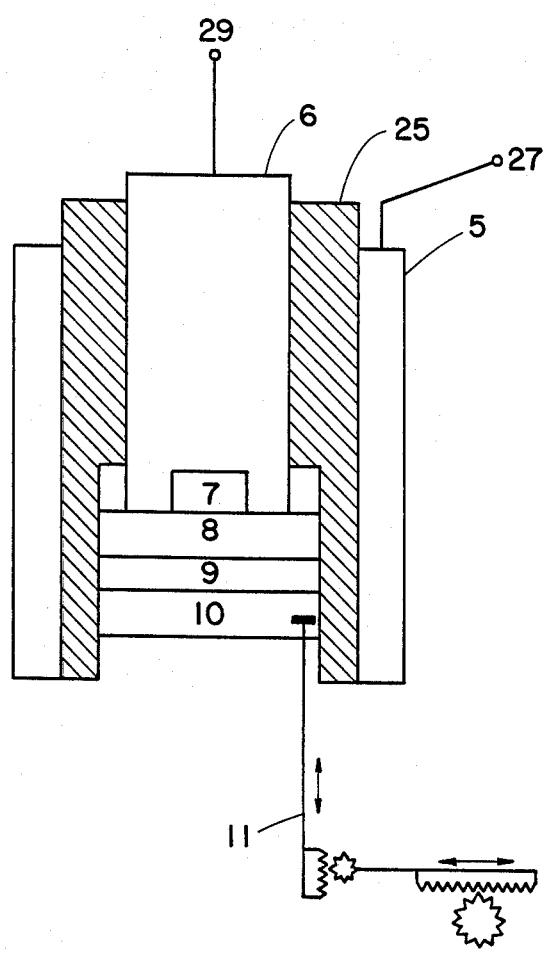
FIG. 2 is a more detailed illustration in cross-section of the electron beam transmitting mask and substrate areas of the apparatus of FIG. 1.

Referring now to FIGS. 1 and 2, there is shown a detailed cross-sectional pictorial representation of a soft vacuum electron beam exposure and dry development apparatus constructed in accordance with the present invention. Electron beam exposure of a thin film, resist or polymer layer takes place in a vacuum chamber 1 which is evacuated through a vacuum valve 14. The ambient working pressure in the vacuum chamber 1 is adjusted to be within the range of 0.001 Torr to several Torr by bleeding in a gas or a combination of gases 18 through the manipulation of valves 19 and 15. Electrical connection to vacuum chamber 1 is made via connection 21. A cold cathode electron gun 2 operating in the abnormal glow region emits secondary electrons from a front face 20 thereof to form an electron beam 16. Front face 20 of cold cathode electron gun 2 preferably comprises either a ceramic metal material having a high secondary electron emission coefficient or a material such as lanthanum hexaboride, also having a high secondary electron emission coefficient and known for its ability to sustain a large emission current without degradation by feedstock gases. See Rocca et al., Glow Discharge Created Electron Beams; Cathode Materials, Electron Gun Designs, and Technological Applications, J. Appl Physics, Vol 56, pp. 790–797 (1984). The cold cathode electron gun 2 has an electrical terminal 17 for connection to a high voltage supply. The cold cathode electron gun 2 may be cooled via ports 30 using conventional gas or liquid techniques for doing so. A metallic enclosure 4 having an aperture 26 therein is placed around the cold cathode electron gun 2. Cold cathode electron gun 2 is electrically insulated from vacuum chamber 1 by an insulator 3. Insulator 3 also limits the secondary electron emission to the front face 20 of cold cathode electron gun 2. Metallic enclosure 4 is electrically insulated from vacuum chamber 1 by an insulating spacer 23. Metallic enclosure 4 is electrically connected via a conventional feedthrough in vacuum chamber 1 to an electrical terminal 22. Metallic enclosure 4 serves several purposes. First, aperture 26 therein acts to select the uniform central portion of electron beam 16 as it is emitted from cathode face 20 and thereby eliminates the non-uniform edges thereof. Second, it screens a substrate 8, which may comprise either a microelectronic wafer or die package substrate, from undesirable material sputtered from the cathode face 20. Third, metallic enclosure 4 reduces the flux of the electron beam 16 reaching the substrate 8 by means of a metallic mesh 24 fully covering the aperture 26 in metallic enclosure 4. Metallic mesh 24 acts to collect a portion of the electrons emitted from the front face 20 of cold cathode electron gun 2. Fourth, metallic enclosure 4 varies both the energy and flux of electrons exiting metallic mesh 24. This is achieved by electrically biasing metallic enclosure 4 with respect to cold cathode electron gun 2. Fifth, metallic enclosure 4 may act as an anode for cold cathode electron gun 2 when the vacuum chamber 1 is electrically floating. A substrate fixture 5 is electrically insulated from the vacuum chamber 1 by an insulator 28 and has an electrical terminal 27 for connection to a source of electrical potential. Substrate fixture 5 is mechanially arranged in a conventional way for controlled motion along the longitudinal axis of electron beam 16. A number of O-rings 31 permit mechanical motion of substrate fixture 5 without breaking the vacuum in vacuum chamber 1. A substrate holder 6 is electrically insulated from substrate fixture 5 by an insulator 25. The substrate holder 6 has an electrical terminal 29 for connection to a source of electrical potential. Substrate 8 is held on a substrate holder 6 so that the electron beam 16 impinges perpendicularly on the substrate 8. An electron beam transmitting mask 10 is held at a constant distance from the substrate 8 by a mask aligner 9. A conventional X-Y mechanical translation device 11 removes the electron beam transmitting mask 10 and the mask aligner 9 from the path of electron beam 16 when necessary. Removal of electron beam transmitting mask 10 and mask aligner 9 is required when the process steps of electron beam flood exposure or bulk plasma dry development are carried out. A heater/cooler 7, imbedded in substrate holder 6 operates conventionally to control the temperature of the substrate holder 6.

A non-reactive gas such as helium may be employed alone for exposure and is preferred from a heat removal standpoint. For similar reasons, hydrogen or a combination of hydrogen and helium may be used. A non-reactive gas and a reactive gas may be used in combination, if complete self-development is desired, whereas lmited self-development will result if a reactive gas is used. Carbon based (organic) polymer resists show enhanced self-development rates in oxygen. Other high resolution inorganic resists such as gold, copper, germanium, selenium, silicon, and their alloys show self-development when halogens or halocarbons are used as ambient gases, since these gases can be chemisorbed to an electron activated site and undergo gasification reaction. See VLSI Electronics, Vol. 8, Academic Press (1984) Chapter 8: Basic Principles of Plasma Etching for Silicon Devices.

A ring-shaped solenoid 12 positioned coaxially with the electron beam 16 creates a constant axial magnetic field that acts to collimate the beam electrons after they pass through electron beam transmitting mask 10 on their way toward substrate 8. Ring-shaped solenoid 12 has electrical terminals 13 that are conventionally fed through vacuum chamber 1 for connection to a suitable power supply. Alternatively, a constant magnetic field may also be produced by a suitable permanent magnet substitued for the ring-shaped solenoid 12.

Unmasked high power electron beam exposure of the thin film, polymer or resist layer material on substrate 8 results in complete ablative removal of that material. In the presence of electron beam transmitting mask 10, partial ablative removal of the material in the spatial regions irradiated is achieved. The result of low power electron beam exposure in the presence of electron beam transmitting mask 10 will result in molecular weight changes in the irradiated regions without any ablative removal of material. In the latter case, a development step is needed to complete the process of creating spatial patterns in the thin film, polymer or resist material on substrate 8. This dry development step can be carried out in the same vacuum chamber 1 by employing a plasma. Organic polymer materials may comprise any of a variety of electron sensitive polymers such as single component polymethyl methacrylate or polimide, co-polymers containing one or several single component polymers such as the co-polymer of polymethyl methacrylate and methacrylic acid, the terpolymers of So/2, 2-methyl-1-pentene, and 2-ethoxy methallyl ether or polymers containing inorganic components such as gold mercaptide, gold acetoactonate, copper acetoactanate, polysiloxanes, etc. The material covering the substrate may also contain an inorganic material such as gold, copper, selenium, germanium or silicon, their alloys such as selenium-germanium, or their oxides such as silica, amorphous chalcogenide film, As/2S/3 films, polytungstic acid films, etc.

Two distinct conditions are used in the dry development plasma step, which follows low power electron beam exposure. Both involve removing the electron beam transmitting mask 10 and mask aligner 9 from the path of the electron beam 16. In the first type of dry development plasma step, the ambient pressure is raised above that used during electron beam exposure. The voltage applied between the cold cathode electron gun 2 and substrate holder 6 is much lower when a higher ambient pressure is used. Substrate fixture 5 is placed much nearer to the cold cathode electron gun 2 than in the case of the beam exposure step. In the development step, metallic enclosure 4 may be self-biased by electrically connecting it to substrate holder 6 through a suitable resistor. Metallic enclosure 4 may also be externally biased by connecting a suitable biasing source between metallic enclosure 4 and substrate holder 6. Either of these biasing arrangements will bring about a change in the potential of metallic enclosure 4 and hence a change in the flux or energy spectrum of electron beam 16. This first type of plasma condition may be called a low voltage flood electron beam development process. In the second type of dry development plasma step, development takes place in a bulk plasma which occurs between metallic enclosure 4, functioning as an anode, and substrate holder 6, functioning as a cathode. Alternatively, cold cathode electron gun 2 may be electrically connected to function as an anode while substrate holder 6 functions as a cathode. This second type of plasma condition may be called the bulk plasma development process.

We claim:

1. A soft vacuum electron beam patterning apparatus comprising:
   vacuum enclosure means;
   a cold cathode abnormal glow discharge electron gun positioned within the vacuum enclosure means for producing a collimated wide area electron beam by abnormal glow discharge;
   high voltage power supply means connected to the cold cathode abnormal glow discharge electron gun for initiating and maintaining the collimated wide area electron beam;
   substrate workpiece means positioned within the vacuum enclosure means for impingement by the collimated wide area electron beam;
   electron beam transmitting mask means positioned in the path of the collimated wide area electron beam spaced apart from and between the substrate workpiece means and the cold cathode abnormal glow discharge electron gun, the electron beam transmitting mask means being movable and reusable;
   mask aligner means for maintaining the electron beam transmitting mask means a fixed distance away from the substrate workpiece means;
   means for selectively removing the electron beam transmitting mask means and the mask aligner means from the path of the collimated wide area electron beam;
   vacuum pump means for evacuating the vacuum enclosure means; and
   gas flow control means for admitting one or more reactive gases and one or more non-reactive gases into the vacuum enclosure means, for controlling the flow thereof through the vacuum enclosure means, and for maintaining the pressure within the vacuum enclosure means at a value greater than $10^{-3}$ Torr.

2. A soft vacuum electron beam patterning apparatus as in claim 1 further comprising:
   metallic enclosure means positioned within the vacuum enclosure means and electrically insulated from the vacuum enclosure means and the cold cathode abnormal glow discharge electron gun, the metallic enclosure means having an aperture therein that is narrower than the collimated wide area electron beam produced by the cold cathode abnormal glow discharge electron gun, the aperture being operative for reducing the width of the collimated wide area electron beam to remove non-uniform beam edges therefrom, thereby sharply defining the area of the collimated wide area electron beam;
   meatllic mesh means covering the aperture in the metallic enclosure means for controlling the intensity and energy of the collimated wide area electron beam; and voltage source means electrically connected to the metallic enclosure means for electrically biasing the metallic enclosure means with respect to the cold cathode abnormal glow discharge electron gun.

3. A soft vacuum electron beam patterning apparatus as in claim 2 further comprising:
   magnetic means positioned coaxially outside the wide area electron beam for providing a constant axial magnetic field acting to collimate the wide area electron beam in a selected area along a longitudinal axis thereof;
   substrate heater/cooler means coupled to the substrate workpiece means for controlling the temperature thereof;
   substrate translation means for controllably moving the substrate workpiece means along the longitudinal axis of the collimated wide area electron beam; and
   substrate bias means connected to the substrate workpiece means for electrically biasing the substrate workpiece means.

4. A soft vacuum electron beam patterning apparatus as in claim 1 wherein:
   said one or more non-reactive gases comprises helium; and
   said one or more reactive gases comprises hydrogen.

5. A soft vacuum electron beam patterning apparatus as in claim 1 wherein:
   said one or more non-reactive gases comprises helium; and
   said one or more reactive gases comprises oxygen.

6. A soft vacuum electron beam patterning apparatus as in claim 1 wherein:
   said one or more non-reactive gases comprises helium; and
   said one or more reactive gases comprises a halogen-containing polyatomic gas.

7. A soft vacuum electron beam patterning apparatus as in claim 6 wherein said halogen-containing polyatomic gas is molecular chlorine.

8. A soft vacuum electron beam patterning apparatus as in claim 6 wherein said halogen-containing polyatomic gas is molecular fluorine.

9. A soft vacuum electron beam patterning apparatus as in claim 6 wherein the halogen-containing polyatomic gas is a halogenated methane polyatomic gas.

10. A soft vacuum electron beam patterning apparatus as in claim 6 wherein the halogen-containing polyatomic gas is a halogenated ethane polyatomic gas.

11. A soft vacuum electron beam patterning apparatus as in claim 1 wherein said cold cathode abnormal glow discharge electron gun comprises a continuous wave cold cathode abnormal glow discharge electron gun.

12. A soft vacuum electron beam patterning apparatus as in claim 1 wherein said cold cathode abnormal glow discharge electron gun comprises a pulsed cold cathode abnormal glow discharge electron gun.

13. A soft vacuum electron beam patterning apparatus as in claim 2 wherein:
   said vacuum enclosure means is maintained at ground electrical potential;
   said cold cathode abnormal glow discharge electron gun is maintained at a selected negative electrical potential; and
   said metallic enclosure means is maintained at a selected negative electrical potential that is between ground potential and that of said cold cathode abnormal glow discharge electron gun.

14. A soft vacuum electron beam patterning apparatus as in claim 3 wherein said magnetic means comprises an electromagnetic solenoid.

15. A soft vacuum electron beam patterning apparatus as in claim 3 wherein said magnetic means comprises a permanent magnet.

16. A soft vacuum electron beam patterning apparatus as in claim 1 wherein said substrate workpiece means includes a coating comprising an organic polymer material.

17. A soft vacuum electron beam patterning apparatus as in claim 1 wherein said substrate workpiece means includes a coating comprising a copolymer material.

18. A soft vacuum electron beam patterning apparatus as in claim 1 wherein said substrate workpiece means includes a coating comprising a polymer containing one or more inorganic elements.

19. A soft vacuum electron beam patterning apparatus as in claim 1 wherein said substrate workpiece means includes a coating comprising an inorganic material.

20. A soft vacuum electron beam patterning apparatus as in claim 19 wherein said coating comprises silicon.

21. A soft vacuum electron beam patterning apparatus as in claim 19 wherein said coating comprises silicon and an oxide thereof.

22. A soft vacuum electron beam patterning apparatus as in claim 19 wherein said coating comprises a mixture of elements selected from columns III and V of the Periodic Table of Elements.

23. A soft vacuum electron beam patterning apparatus as in claim 19 wherein said coating comprises a mixture of elements selected from columns II and VI of the Periodic Table of Elements.

24. A soft vacuum electron beam patterning apparatus as in claim 17 wherein said coating comprises a ceramic material.

25. A soft vacuum electron beam patterning apparatus as in claim 19 wherein said coating comprises a metallic glass material.

26. A soft vacuum electron beam patterning apparatus as in claim claim 1 wherein said cold cathode abnormal glow discharge electron gun includes a cathode constructed of a ceramic metal material having a high secondary electron emission coefficient.

27. A soft vacuum electron beam patterning apparatus as in claim 1 further comprising coolant means coupled to the cold cathode abnormal glow discharge electron gun for controlling the temperature thereof.

28. A soft vacuum electron beam patterning apparatus as in claim 1 wherein said cold cathode abnormal glow discharge electron gun includes a cathode constructed of lanthanum hexaboride.

29. A soft vacuum electron beam patterning apparatus comprising:
   vacuum enclosure means;
   a cold cathode abnormal glow discharge electron gun positioned within the vacuum enclosure means for producing a collimated wide area electron beam by abnormal glow discharge;
   high voltage power supply means connected to the cold cathode abnormal glow discharge electron gun for initiating and maintaining the collimated wide area electron beam;

substrate workpiece means positioned within the vacuum enclosure means for impingement by the collimated wide area electron beam;

electron beam transmitting mask means positioned in the path of the collimated wide area electron beam spaced apart from and between the substrate workpiece means and the cold cathode abnormal glow discharge electron gun, the electron beam transmitting mask means being movable and reusable;

mask aligner means for maintaining the electron beam transmitting mask means a fixed distance away from the substrate workpiece means;

means for selectively removing the electron beam transmitting mask means and the mask aligner means from the path of the collimated wide area electron beam;

metallic enclosure means positioned within the vacuum enclosure means and electrically insulated from the vacuum enclosure means and the cold cathode abnormal glow discharge electron gun, the metallic enclosure means having an aperture therein that is narrower than the collimated wide area electron beam produced by the cold cathode abnormal glow discharge electron gun, the aperture being operative for reducing the width of the collimated wide area electron beam to remove non-uniform beam edges therefrom, thereby sharply defining the area of the collimated wide area electron beam;

vacuum pump means for evacuating the vacuum enclosure means;

gas flow control means for admitting one or more reactive gases and one or more non-reactive gases into the vacuum enclosure means, for controlling the flow thereof through the vacuum enclosure means, and for maintaining the pressure within the vacuum enclosure means at a value greater than $10^{-3}$ Torr;

means for maintaining said substrate workpiece means at a selected positive electrical potential;

means for maintaining said metallic enclosure means at a selected positive electrical potential lower than that of said substrate workpiece means; and means for maintaining said cold cathode abnormal glow discharge electron gun at a selected negative electrical potential.

30. A soft vacuum electron beam patterning apparatus comprising:

vacuum enclosure means;

a cold cathode abnormal glow discharge electron gun positioned within the vacuum enclosure means for producing a collimated wide area electron beam by abnormal glow discharge;

high voltage power supply means connected to the cold cathode abnormal glow discharge electron gun for initiating and maintaining the collimated wide area electron beam;

substrate workpiece means positioned within the vacuum enclosure means for impingement by the collimated wide area electron beam;

electron beam transmitting mask means positioned in the path of the collimated wide area electron beam spaced apart from and between the substrate workpiece means and the cold cathode abnormal glow discharge electron gun, the electron beam transmitting mask means being movable and reusable;

mask aligner means for maintaining the electron beam transmitting mask means a fixed distance away from the substrate workpiece means;

means for selectively removing the electron beam transmitting mask means and the mask aligner means from the path of the collimated wide area electron beam;

metallic enclosure means positioned within the vacuum enclosure means and electrically insulated from the vacuum enclosure means and the cold cathode abnormal glow discharge electron gun, the metallic enclosure means having an aperture therein that is narrower than the collimated wide area electron beam produced by the cold cathode abnormal glow discharge electron gun, the aperture being operative for reducing the width of the collimated wide area electron beam to remove non-uniform beam edges therefrom, thereby sharply defining the area of the collimated wide area electron beam;

vacuum pump means for evacuating the vacuum enclosure means;

gas flow control means for admitting one or more reactive gases and one or more non-reactive gases into the vacuum enclosure means, for controlling the flow thereof through the vacuum enclosure means, and for maintaining the pressure within the vacuum enclosure means at a value greater than $10^{-3}$ Torr;

means for maintaining said substrate workpiece means at a selected negative electrical potential;

means for maintaining said metallic enclosure means at a selected positive electrical potential; and means for maintaining said cold cathode abnormal glow discharge electron gun at or above ground electrical potential.

* * * * *

UNITED STATES PATENT AND TRADEMARK OFFICE
CERTIFICATE OF CORRECTION

PATENT NO. : 4,827,137
DATED : May 2, 1989
INVENTOR(S) : George J. Collins et al.

It is certified that error appears in the above-identified patent and that said Letters Patent is hereby corrected as shown below:

Column 1, line 11, "of" should be "for"; and

Column 8, line 40, claim 24, "claim 17" should read --claim 19--.

Signed and Sealed this

Tenth Day of July, 1990

Attest:

HARRY F. MANBECK, JR.

Attesting Officer

Commissioner of Patents and Trademarks